United States Patent [19]

Yamashita et al.

[11] Patent Number: 5,031,308

[45] Date of Patent: Jul. 16, 1991

[54] METHOD OF MANUFACTURING MULTILAYERED PRINTED-WIRING-BOARD

[75] Inventors: Kazuo Yamashita; Eiki Takahashi; Osamu Teshigawara; Masaki Kinoshita; Takeshi Eimura; Takao Ohiwa, all of Tokyo, Japan

[73] Assignee: Japan Radio Co., Ltd., Tokyo, Japan

[21] Appl. No.: 456,946

[22] Filed: Dec. 26, 1989

[30] Foreign Application Priority Data

| Dec. 29, 1988 | [JP] | Japan | 63-332013 |
| Mar. 29, 1989 | [JP] | Japan | 1-77480 |
| Jun. 13, 1989 | [JP] | Japan | 1-149972 |
| Jul. 27, 1989 | [JP] | Japan | 1-194928 |
| Sep. 13, 1989 | [JP] | Japan | 1-237478 |

[51] Int. Cl.⁵ .............................. H05K 3/36
[52] U.S. Cl. ............................ 29/830; 29/840; 174/259; 361/408; 361/412
[58] Field of Search ............ 29/830, 840, 739; 361/412, 414, 408; 174/259

[56] References Cited

U.S. PATENT DOCUMENTS

| 3,307,246 | 3/1967 | Gulliksen et al. | 361/412 X |
| 3,616,532 | 11/1971 | Beck | 361/408 X |
| 3,646,670 | 3/1972 | Maeda et al. | 29/830 |
| 3,780,352 | 12/1973 | Redwanz | 361/414 |
| 3,795,047 | 3/1974 | Abolafia et al. | 361/412 X |
| 3,835,531 | 9/1974 | Luttmer | 29/830 X |
| 4,157,932 | 6/1979 | Hirata | 29/830 |
| 4,299,302 | 2/1981 | Crepeau | 29/830 |
| 4,368,503 | 1/1983 | Kurosawa et al. | 361/414 |
| 4,692,843 | 9/1987 | Matsumoto et al. | 361/414 |
| 4,788,766 | 12/1988 | Burger et al. | |
| 4,818,728 | 4/1989 | Rai et al. | 29/739 X |

FOREIGN PATENT DOCUMENTS

| 3316017 | 11/1984 | Fed. Rep. of Germany . |
| 88-04878 | 6/1988 | PCT Int'l Appl. . |
| 660827 | 6/1987 | Switzerland . |
| 964480 | 7/1964 | United Kingdom . |

OTHER PUBLICATIONS

IBM Tech. Discl. Bull., vol. 21, No. 12, May 1979, pp. 4796–4796, by Abolafia et al.

Primary Examiner—Carl J. Arbes
Attorney, Agent, or Firm—Koda and Androlia

[57] ABSTRACT

A method of manufacturing a mutilayered printed-wiring-board comprises attaching conductive members on conductive layers, superimposing a plurality of printed-wiring boards, and electrically connecting the conductive layers with one another by the conductive members.

8 Claims, 8 Drawing Sheets

METHOD OF MANUFACTURING MULTILAYERED PRINTED-WIRING-BOARD

BACKGROUND OF THE INVENTION

1. Field of the Invention:

This invention relates to the production of multilayered printed-wiring-boards, and more particularly to a method of manufacturing a multilayered printed-wiring-board by electrically connecting a plurality of printed-wiring-boards (hereinafter called "PWB") together.

2. Description of the Related Art:

Heretofore, attempts have been made to install circuit elements on a substrate with high-concentration to realize an integrated circuit board. To this end, it is a known practice to use a multilayered PWB, in which insulating and conductive layers are placed alternately one over another. Another popular method is to use a multilayered printed-circuitboard (hereinafter called "multilayered PCB"), in which various circuit elements are installed on and/or inside a multilayered PWB.

The multilayered PWB and PCB are particularly useful when realizing a compact-sized and high-concentration circuit of high frequency, such as 400 MHz band, 800–900 MHz band and 1.5 GHz band, in automobile and portable telephones, for example.

In the manufacture of a multilayered PWB or PCB, it is known to unified a plurality of PWBs by superimposing.

As is well known in the art, a PWB is produced by providing a conductive layer on the surface of an insulating substrate and forming an additional conductive layer thereover in a desired pattern according to need. A copper foil or a conductive paste, for example, is used for the conductive layer.

Further, a PWB having a conductive layer on only one of opposite surfaces is called a single-face PWB, while a PWB having a conductive layer on either one of opposite surfaces is called a double-face PWB.

Figure 13:
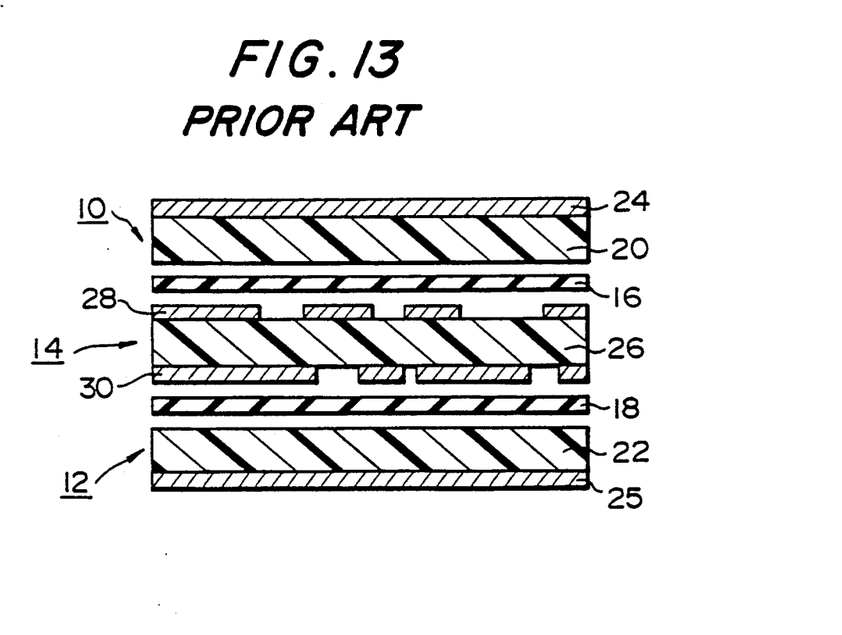
FIG. 13 is a cross-sectional view of components for manufacturing a multilayered PWB in a prior art method.
Figure 14:
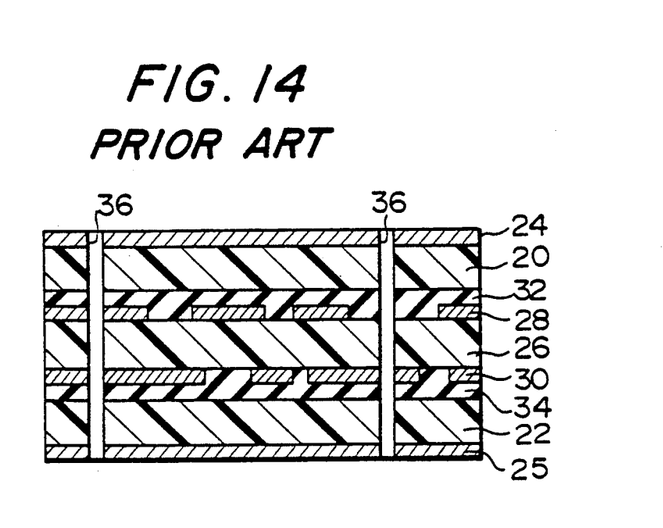
FIG. 14 is a cross-sectional view of the components of FIG. 13, showing them after having been processed by pressurizing and heating and also by forming through-holes.
Figure 15:
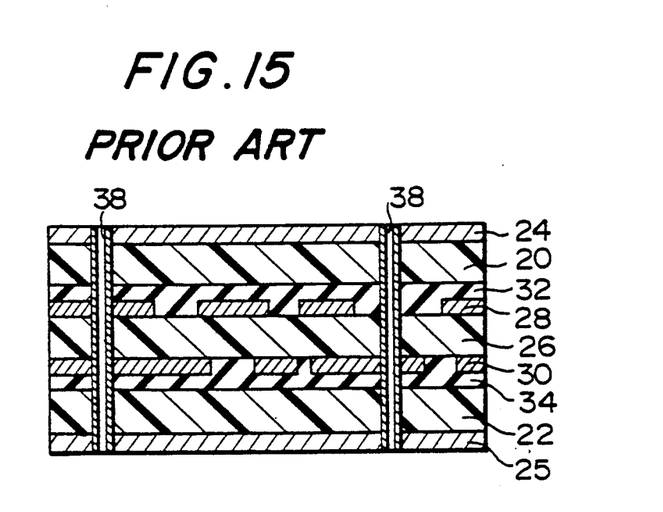
FIG. 15 is a cross-sectional view of the components of FIG. 14, showing them after the through-holes have been plated.

FIGS. 13 through !5 are cross-sectional views showing progressive manufacturing steps of a multilayered PWB according to the typical conventional method, which will now be described in greater detail. The conventional production of a multilayered PCB is similar to that of a multilayered PWB except for an additional step of installing circuit elements, and therefore, its detailed description is omitted here for clarity.

In FIG. 13, two single-face PWB 10, 12, a double-face PWB 14, and two inter-layer adhesive sheets 16, 18 are shown.

Each of the single-face PWB 10, 12 is composed of an insulating substrate 20, 22, and a conductive layer 24, 25 in the form of a copper foil attached on one surface of the insulating substrate 20, 22. The conductive layer 24, 25 is free of patterning.

The double-face PWB 14 is composed of an insulating substrate 26, and a conductive layer 28, 30 attached on either one of opposite surface of the insulating substrate 26. The conductive layer 28, 30 is previously formed in a pattern necessary to realize a desired circuit.

The conductive layer 24, 25 has a thickness of about 18 to 35 $\mu$m, for example, while the conductive layer 28, 30 has a thickness of about 70 $\mu$m, for example. Thus the conductive layer 28, 30 is larger in thickness than the conductive layer 24, 25 for securing reliability of connection between the conductive layers 28, 30 and the through-holes after the through-hole forming described below.

The inter-layer adhesive sheet 16, 18 is a sheet commonly called "prepreg". The inter-layer adhesive sheet 16, 18 is formed of an epoxy resin material curable under a predetermined curing condition (i.e., temperature and time). In general, this material is very popular for inter-layer adhesive sheets.

In production, first of all, these components are placed one over another.

For example, as shown in FIG. 13, the single-face PWB 10, the inter-layer adhesive sheet 16, the double-face PWB 14, the inter-layer adhesive sheet 18, and the single-face PWB 12 are placed one over another in this order.

Further, the conductive layer 24 of the single-face PWB 10 faces upwardly, while the conductive layer 25 of the other single-face PWB 12 faces downwardly. Namely, these two single-face PWBs 10, 12 are placed in such a manner that their respective conductive layers 24, 25 face outwardly in opposite directions.

In this superimposed position, all of the superimposed components are heated at a predetermined temperature for a predetermined time, with applying a pressure in the direction of superimposing. At that time the adjacent superimposed parts come into contact with each other.

For example, all of the superimposed components are clamped between a pair of flat stainless plates in the direction of superimposing, and are pressed by a pressure of 30 kgf/cm$^2$ At that time, they are heated at a temperature higher than a curing temperature of the inter-layer adhesive sheet 16, 18, e.g., 170° C., for 90 minutes.

Under this pressure and heat, the inter-layer adhesive sheets 16, 18 are cured to form a pair of insulating layers 32, 34 covering the conductive layers 28, 30 of the double-face PWB 14. In addition, the single-face PWBs 10, 12 are adhered one to each surface of the double-face PWB 14 by the respective insulating layers 32, 34.

Then, sub-through-holes 36 are formed through the superimposed components at predetermined positions in the direction of superimposing, as shown in FIG. 14.

As the inner surface of the individual subthrough-hole 36 is plated to extract copper, the conductive layers 24, 28, 30, 25 are electrically connected at portions where the sub-through-holes 36 are formed, as shown in FIG. 15. That is, the conductive layers 24, 28, 30, 25 are electrically connected by through-holes 38 having an inner surface coated with copper.

Subsequently, the conductive layers 24, 25 are processed by patterning. If the patterning was done before forming the sub-through-holes 36, an accurate pattern could not have been achieved. This is the reason why the patterning is done after having formed the through-holes. As a result, a multilayered PWB has been completed in which a desired circuit is formed as patterns of the conductive layers 24, 28, 30, 25. In this conventional case, there are four conductive layers, which thus constitute a four-layered PWB.

Thus in the conventional art, a plurality of PWBs are superimposed into a unitary form, and then the conductive layers of the PWBs are electrically connected by through-holes.

However, if the sub-through-holes are formed after the PWBs have been superimposed into a unitary form, good smearing is difficult to achieve.

Further, in the foregoing manufacturing method, after having formed the sub-through-holes, it is necessary to take a wet processing such as plating and patterning.

But if a liquid penetrates into the multilayered PWB during the wet processing, it would result in various troubles such as oxidation of the conductive layers, oxidation of the conductive layers and shortcircuit between the patterns.

With the foregoing conventional methods, only a limited rate of production of good quality multilayered PWBs can be achieved. The same can be said of multilayered PCBs.

SUMMARY OF THE INVENTION

It is therefore an object of this invention to provide a method of manufacturing multilayered PWBs at a high rate of production of good quality products, without forming any through-hole as a means for electrically connecting conductive layers on PWBs.

According to a first aspect of this invention, there is provided a method of manufacturing a multilayered printed-wiring-board, comprising the steps of: (a) attaching a conductive member on a partial surface of a conductive layer formed on at least one of opposite surfaces of a printed-wiring-board in a pattern; (b) superimposing a plurality of printed-wiring-boards one over another in such a manner that the conductive member formed and attached on the conductive layer on one of the printed-wiring-boards confronts either the conductive layer or the conductive member on another printed-wiring-boards, at least one of the plurality of printed-wiring-boards having been processed by the attaching step; and (c) after the superimposing step, electrically connecting the conductive member to either the confronting conductive layer or the confronting conductive member to form an electrical connecting layer.

According to a second aspect of this invention, there is provided a method of manufacturing a multilayered printed-wiring-board, comprising the steps of: (a) attaching a conductive member on a partial surface of a conductive layer formed on at least one of opposite surfaces of a printed-wiring-board in a pattern; (b) attaching an electrically insulating member on a partial surface of the conductive layer at least a conductive-member-free portion thereof; (c) superimposing a plurality of printed-wiring-boards one over another in such a manner that the conductive member attached on the conductive layer on one of the printed-wiring-boards confronts either the conductive layer or the conductive member on another printed-wiring-boards, at least one of the plurality of printed-wiring-boards having been processed by the first-named attaching step and the second-named attaching step; and (d) after the superimposing step, electrically connecting the conductive member to either the confronting conductive layer or the confronting conductive member to form an electrical connecting layer.

According to a third aspect of this invention, there is provided a method of manufacturing a multilayered printed-wiring-board, comprising the steps of: (a) attaching a conductive member on a partial surface of a conductive layer formed on at least one of opposite surfaces of a printed-wiring-board in a pattern, the conductive member including a plurality of spacer pieces each having a substantially constant thickness; (b) superimposing a plurality of printed-wiring-boards one over another in such a manner that the conductive member formed and attached on the conductive layer on one of the printed-wiring-boards confronts either the conductive layer or the conductive member on another printed-wiring-boards, at least one of the plurality of printed-wiring-boards having been processed by the attaching step; and (c) after the superimposing step, electrically connecting the conductive member to either the confronting conductive layer or the confronting conductive member to form an electrical connecting layer.

In the first method of this invention, an electrical connecting layer connecting the conductive layers of a plurality of PWBs by the conductive member attached on a partial surface of the conductive layer of the individual PWB. It is therefore possible to avoid any defects, such as inadequate smear, inadequate penetration, etc., resulting from the forming of through-holes. Also, it is needless to make the thickness of the individual inner conductive layer larger than that of the individual outer conductive layer. Further, the outwardly facing conductive layer of the outmost PWB may be previously processed by patterning.

The same results as the first method can be obtained with the second method. An additional result with the second method is that insulation between the conductive layers can be achieved at desired positions.

The same results as the first method can be obtained with the third method. In addition, it is possible to attach the conductive member within a desired section with improved precision, thus causing an improved pattern accuracy and a high concentration of pattern.

The PWB may be either a single-face PWB or a double-face PWB.

If a buffer layer is attached over the surface of the conductive layer, a thermal stress acting on the conductive layer is reduced.

Also it is possible to install circuit elements on the conductive layer.

Further, the conductive member may be either a solder material, e.g., a solder paste having a predetermined melting point or a conductive resin having a predetermined curing temperature. In the former case, the solder paste is attached on the conductive layer such as by printing and subsequent reflowing. In the latter case, the conductive resin is attached on the conductive layer such as by potting.

When using a solder paste as the conductive member in the third method, the melting point of the solder paste is preferably lower than the melting point of the spacer pieces. In this case, the step of attaching the conductive member may include a step of mixing the spacer pieces in the conductive member at a mixture ratio depending on the amount of thermal shrinkage of the conductive member.

The connecting step may include a pressurizing step in which a plurality of the superimposed PWBs are clamped in the direction of superimposing, and in which a predetermined pressure in the direction of superimposing is applied to the superimposed PWBs to bring the conductive member in contact with the confronting conductive layer or the confronting conductive member. If the insulating member is used, the insulating member is brought in contact with the confronting conductive layer or the confronting insulating member during the pressurizing step.

Further, the connecting step may also include a heating step in which a predetermined temperature of heat is applied to the superimposed BWBs to fix the conductive member to the conductive layer or the conductive member.

The heating step is performed by applying ultrasonic waves, in which case an oxidized layer at the border of the conductive layer and the conductive member is dispersed, and as a result, the conductive layer and the conductive member jointly constitute an alloy or diffuse together to connect with each other firmly. The heating step may be conducted concurrently with the pressurizing step.

The insulating member may be an insulating adhesive resin having a predetermined curing temperature. In this case, the attaching of the insulating member to the conductive layer may be performed by printing. Most preferably, the conductive member may be a solder paste having a melting point higher than a curing temperature of the insulating adhesive resin.

The shape of the individual spacer piece may be a sphere and should by no means be limited to a specific shape. The material of the spacer pieces is preferably metal such as copper, or ceramic.

The above and other advantages, features and additional objects of this invention will be manifest to those versed in the art upon making reference to the following detailed description and the accompanying drawings in which several embodiments incorporating the principles of this invention are shown by way of illustrative example.

DETAILED DESCRIPTION

Figure 1:
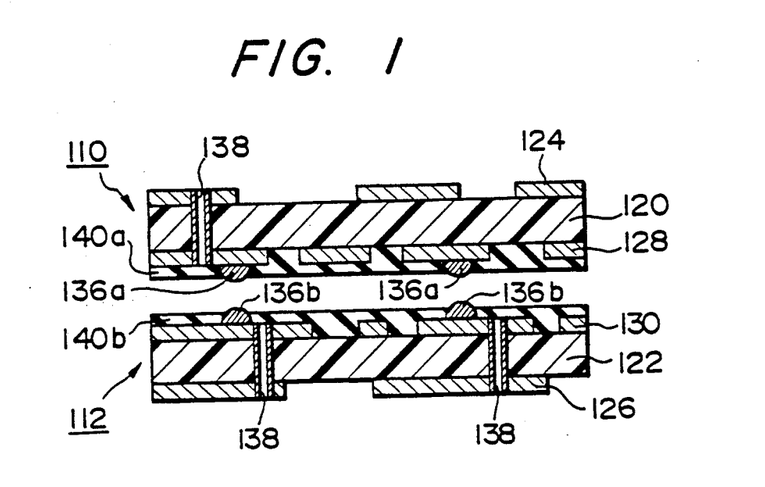
FIG. 1 is a cross-sectional view of components for manufacturing a multilayered PWB in a method according to a first embodiment of this invention.
Figure 2:
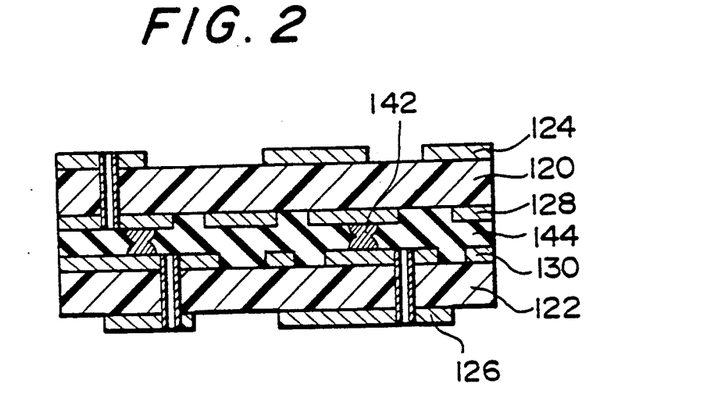
FIG. 2 is a cross-sectional view of the components of FIG. 1, showing them after having been processed by pressurizing and heating.

FIGS. 1 and 2 show various components for manufacturing a multilayered PWB in a method according to a first embodiment of this invention.

In this embodiment, two double-face PWB 110, 112 and four conductive layers 124, 128, 130, 126 are all previously processed by patterning. Each of the conductive layers 124, 128, 130, 126 is a copper foil having a thickness of about 18-35 $\mu$m, for example.

Each of the double-face PWB 110, 112 has a through-hole 138 at a predetermined position, the inner surface of the through hole 138 being plated. The through-hole 138 electrically connects front and rear conductive layers 124, 128 or 130, 126 together.

A solder paste is printed on the conductive layers 128, 130 of the double-face pWBs 110, 112 at predetermined positions, or solder bumps 136a, 136b are formed by solder reflow.

Then, a polymer resin 140a, 140b is printed on the surface of the conductive layer 128, 130 at portions devoid of the solder oump 136. A binder contained in the polymer resin 140a, 140b is discharged into the atmosphere so that the polymer resin 140a, 140b is precured.

As shown in FIG. 1, the foregoing components are placed one over another. Specifically, after the polymer resin 140a, 140b have been precured, the two double-face PWBs 110, 112 are placed one over another in such a manner that the solder bumps 136a on one double-face PWB 110 confront the solder bumps 136b on the other double-face PWB 112.

Subsequently, these two double-face PWBs 110, 112 are processed by pressurizing and heating concurrently. For example, the double-face PWBs 110, 112 are clamped between a pair of flat plates in the direction of superimposing, under pressure and heat. The flat plates are stainless steel, for example.

This pressurizing and heating are conducted separately at first and second stages. At the first stage, vapor-phase soldering is conducted at a temperature, e.g., 220° C., higher than the melting point of the solder bumps 136a, 136b for two minutes. In this first stage, the solder bumps 136a, 136b are fused to form fused solder bumps 142 (FIG. 2) which electrically connect the conductive layers 128, 130 with one another. Meanwhile, the polymer resins 140a, 140b are brought in contact with one another due to the reduced viscosity resulting from the temperature rise and also due to pressure.

This first stage is followed by the second stage, in which the polymer resins 140a, 140b are cured by heating at 150° C. for about one hour. As a result, a unitary insulating 144 (FIG. 2) has been formed to insulate the conductive layers 128, 130 from one another.

From the foregoing steps, a composite PWB having four conductive layers, namely, a four-layered PWB can be obtained, as shown in FIG. 2.

In this first embodiment, after the two double-face PWBs 110, 112 have been superimposed into a unitary form, it is unnecessary to form any throughhole, and the PWBs 110, 112 may be previously processed by patterning.

Therefore, it is possible to prevent various defects, such as inadequate smear, inadequate penetration of plating liquid, etc., resulting from the forming of through-holes. Also other defects due to permeation of the liquid for forming the pattern can be prevented. Consequently, an improved rate of production of good quality products can be achieved, thus minimizing the occurrences of manufacturing problems.

In addition, it is possible to use, as the individual conductive layer, a copper foil having a thickness smaller than the prior art. Therefore high-concentration patterning and an improved degree of circuit integration can be achieved.

A green sheet may be used instead of the polymer resin 140a, 140b. The solder paste may be a high-temperature or low-temperature paste now put on the market, or may be a eutectic solder.

Figure 3:
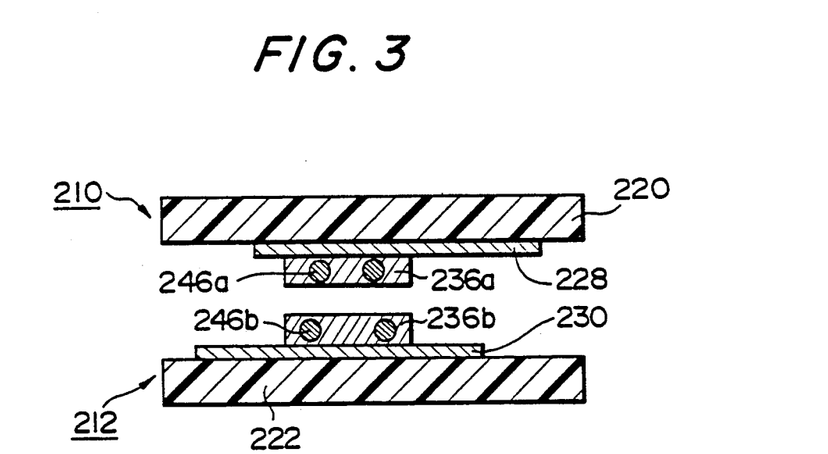
FIG. 3 is a cross-sectional view of components for manufacturing a multilayered PWB in a method according to a second embodiment.
Figure 4:
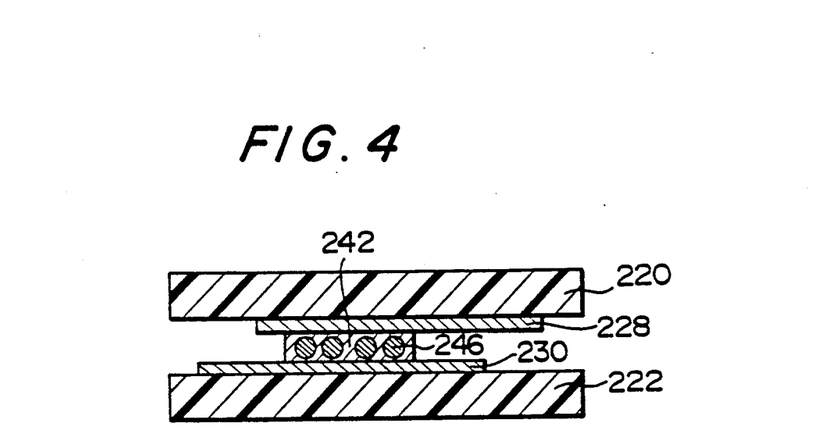
FIG. 4 is a cross-sectional view of the components of FIG. 3 showing them after having been processed by pressurizing and heating.

FIGS. 3 and 4 show various components for manufacturing a multilayered PWB in a method according to a second embodiment;

In the second embodiment, a conductive layer 228, 230 of each of two single-face PWBs 210, 212 is a copper foil and is previously processed by patterning.

Firstly, a solder paste such as a eutectic solder is printed on the conductive layers 228, 230 at predetermined positions and is then reflowed to form fused solder bumps 236a, 236b one on each conductive layer 228, 230.

Then, the two single-face PWBs 210, 212 are placed one over another in such a manner that their respective solder bumps 236a, 236b confront one another.

In this embodiment, copper balls 246a, 246b are previously mixed in the respective printed solder pastes. The rate of mixture of the copper balls 246a, 246b is determined depending on the coefficient of reduction of the flux component of the solder paste due to the reflow.

This state is shown in FIG. 3, from which state pressure and heat, like the first embodiment, are applied to the components to form a fused solder bump 242. As a result, a double-layered PWB has been obtained, as shown in FIG. 4.

In the second embodiment, in addition to the results obtained in the first embodiment, it is possible to keep the distance between the conductive layers 228, 230 constant, namely, equal to the diameter of the individual copper ball 246. Consequently, it is possible to prevent the solder bumps 236 from projecting, thus causing an improved pattern precision and also a highly concentrated pattern.

Instead of being previously mixed in the solder paste, the copper balls 246 may be placed on or may be forcedly mixed in the printed solder paste or the conductive resin processed by potting.

Figure 5:
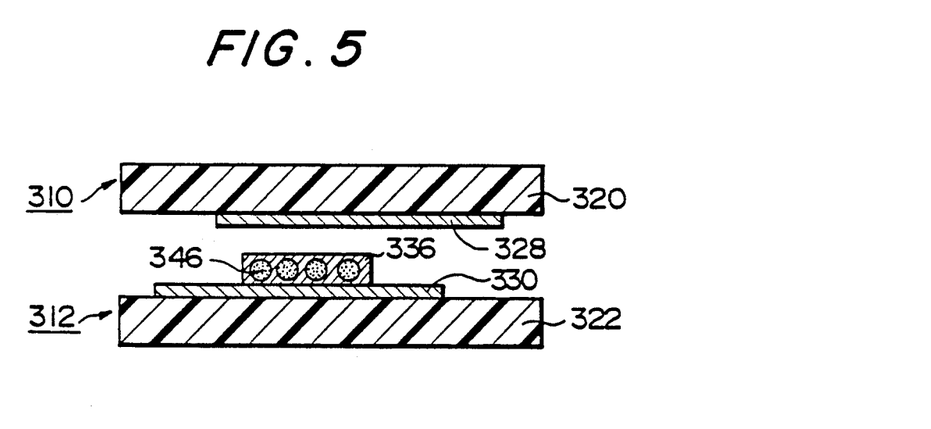
FIG. 5 is a cross-sectional view of components for manufacturing a multilayered PWB in a method according to a third embodiment.
Figure 6:
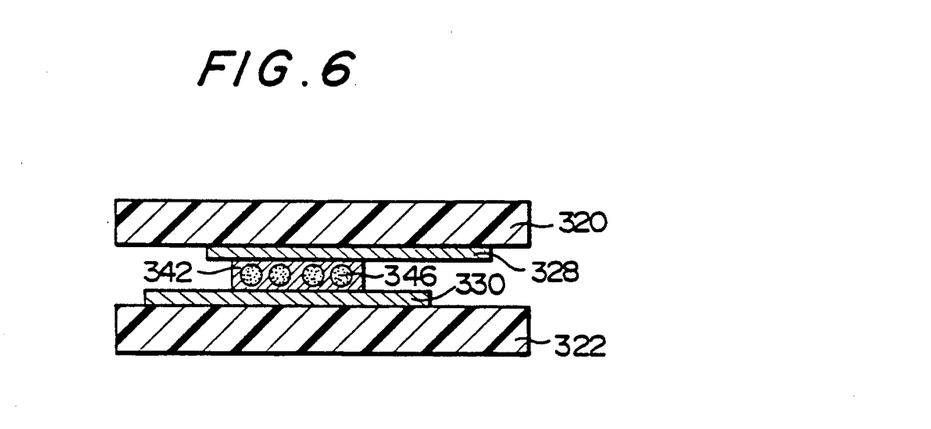
FIG. 6 is a cross-sectional view of the components of FIG 5, showing them after having been processed by pressurizing and heating.

FIGS. 5 and 6 show various components for manufacturing a multilayered PWB in a method according to a third embodiment.

In this embodiment, a conductive resin 336 is attached, by potting, on only one 330 of two conductive layers 328, 330 of two single-face PWBs 310, 312, like the single-face PWBs in the second embodiment.

After the conductive resin 336 has been thus attached on one conductive layer 330, ceramic balls are forcedly mixed in this conductive resin 336.

FIG. 5 shows the single-face PWBs 310, 312 having placed one over another in such a manner that the conductive resin 336 attached on the conductive layer 330 by potting confronts a predetermined portion of the conductive layer 328.

As from the state of FIG. 5, the components are pressurized in the superimposing direction under heating, the conductive resin 336 is cured to provide a conductive adhesive portion.

In the third embodiment, the same results as the second embodiment can be obtained.

Ceramic balls 346 may be previously either mixed in or placed on the conductive resin 336.

In the second and third embodiments, the copper balls 246 or the ceramic balls 346 are used; alternatively, small pieces of a different shape may be used. But the individual small piece should have a constant size in the direction of thickness to keep the intersubstrate distance constant.

Small pieces of a different material, such as iron or heat-resistant resin, may be used instead of the copper balls 246 or ceramic balls 346.

Figure 7:
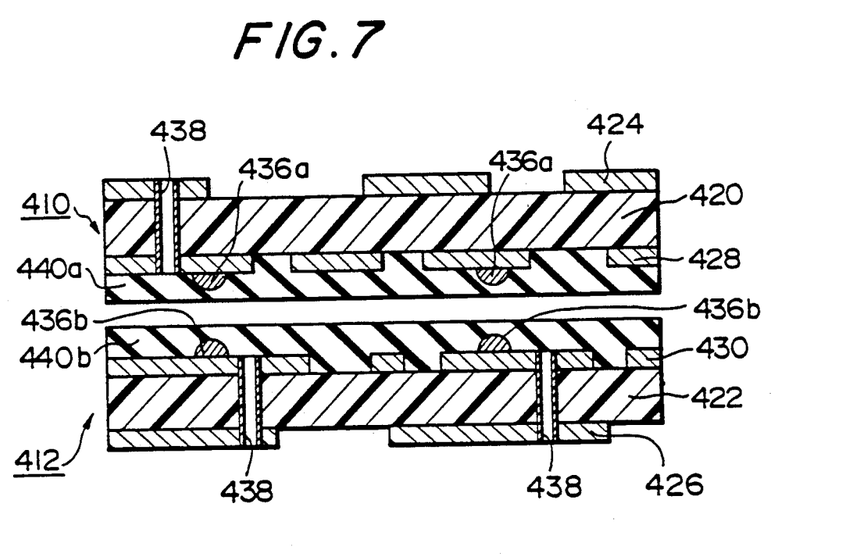
FIG. 7 is a cross-sectional view of components for manufacturing a multilayered PWB in a method according to a forth embodiment.
Figure 8:
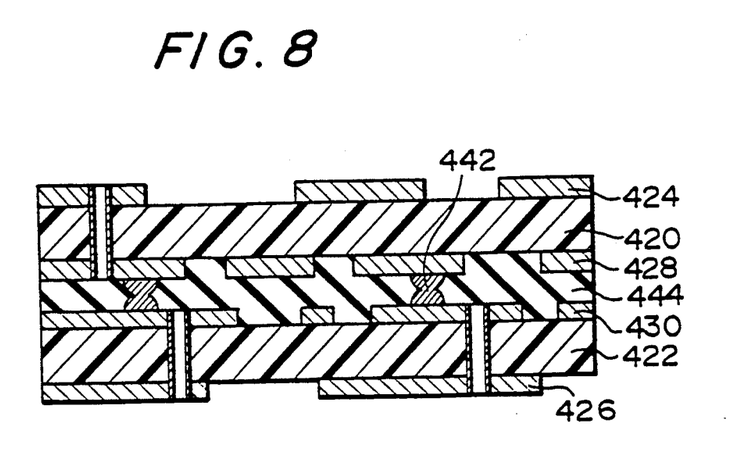
FIG. 8 is a cross-sectional view of the components of FIG. 7, showing them after having been processed by pressurizing and heating.

FIGS. 7 and 8 show various components for manufacturing a multilayered PWB in a method according to a fourth embodiment.

In this embodiment, like the first embodiment, solder bumps 436a, 436b are formed on conductive layers 428, 430 of double-face PWBs 420, 422 at predetermined positions, and polymer resins 440a, 440b are attached on the double-face PWBs 420, 422, whereupon these components are placed one over another.

In FIG. 7, the components are shown after the polymer resins 440a, 440b have been attached on the double-face PWBs 420, 422 and also after these double-face PWBs 420, 422 have been placed one over another.

As is seen from FIG. 7, there are following differences, concerning the attaching of polymer resin, between first and fourth embodiments. In the first embodiment, the polymer resins 140a, 140b are attached on the double-face PWBs 120, 122 so as not to lie over the solder bumps 136a, 136b. In the fourth embodiment, the polymer resins 440a, 440b are attached on the double-face PWBs 420, 422 so as to lie over the solder bumps 436a, 436b; the polymer resins 440a, 44b should be a resin having a curing temperature lower than the melting point of the solder bumps 436a, 436b.

When the components of FIG. 7 is pressed in the superimposing direction by a predetermined pressure and at the same time, is heated at a temperature higher than the melting point of at least the solder bumps 436a, 436b, the solder bumps 436a, 436b are fused except the polymer resins 440a, 440b as the curint temperature of the polymer resins 440a, 440b is lower than the melting point of the solder bumps 436a, 436b. As a result, the fused solder bumps 442 have been formed to electrically connect the conductive layers 428, 430. At that time, the polymer resins 440a, 440b are in contact with one another as pressurized.

When the components are heated at the curing temperature of the polymer resins 440a, 440b, the polymer resins 440a, 440b is cured into a unitary form to form a unified insulating layer 444.

As the foregoing steps are thus conducted, a four-layered PWB of FIG. 8 has been manufactured.

In the fourth embodiment, the same results as the first embodiment can be obtained. Additionally, in this embodiment, the attaching of the polymer resins 440a, 440b by printing can be conducted without considering the portions to which the solder bumps 436a, 436b are attached. Therefore, with the fourth embodiment, it is possible to manufacture a multilayered PWB easily, compared with the first embodiment.

Figure 9:
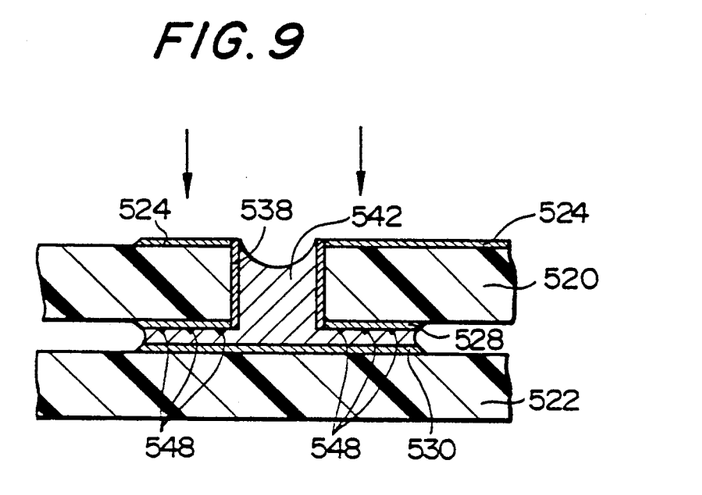
FIG. 9 is a cross-sectional view of components for manufacturing a multilayered PWB in a method according to a fifth embodiment.
Figure 10:
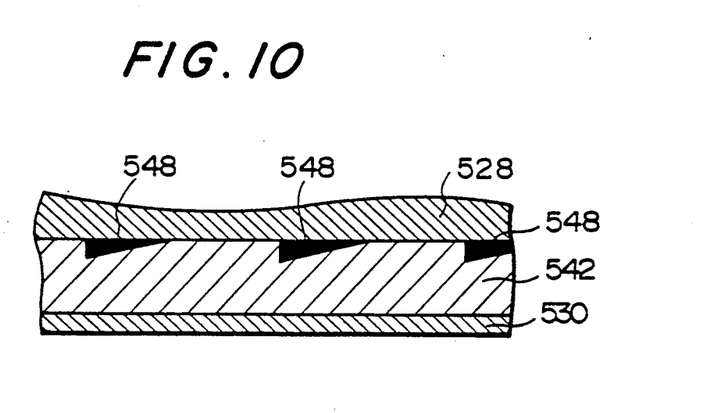
FIG. 10 is an enlarged cross-sectional view showing the junction between a solder bump and a conductive layer in the fifth embodiment.

FIGS. 9 and 10 show various components for manufacturing a multilayered PWB in a method according to a fifth embodiment.

In this embodiment, firstly a via hole 538 is formed in a double-face PWB 520, and the inner surface of the via hole 538 is plated. On the conductive layer 530 of another PWB 522, the solder bump containing 2% of silver, 62% of tin and 36% of lead and having a melting point of 179° is attached. Yet the double-face PWB 520 and the PWB 522 are place one over another in such a manner that this solder bump confronts the via hole 538.

Then the via hole 538 and the solder bump are electrically connected. In this embodiment, following steps are adopted to electrically connect the via hole 538 and the solder bump.

Ultrasonic waves and a predetermined pressure are applied over the double-face PWB 520 and the PWB 522 in the superimposing direction indicated by arrows in FIG. 9.

At that time the ultrasonic waves causes the temperature of the solder bump to rise. As the temperature of the solder bump increases over its melting point, the solder bump fuses to form a fused solder bump 542. Accordingly the conductive layer 530 and the plated inner surface of the via hole 538 confronting the conductive layer 530 are electrically connected by the fused solder bump 542, whereupon application of the ultrasonic waves is stopped. As a result, a multilayered PWB electrically connected by the fused solder bump 542 as shown in FIG. 9 has been obtained.

In the fifth embodiment, the same results as the first embodiment can be obtained. Additionally, in this embodiment, oxides 548 having formed on the conductive layer 528, for example, due to the heat is dispersed more than directly heating, as shown in FIG. 10. Therefore, the connection between the fused solder bump 542 and the conductive layer 528 is firm, thus causing a multilayered PWB which is resistant to thermal shock and low in impedance between the substrates.

An auxiliary direct heating concurrent with application of the ultrasonic waves also causes the same results.

Figure 11A:
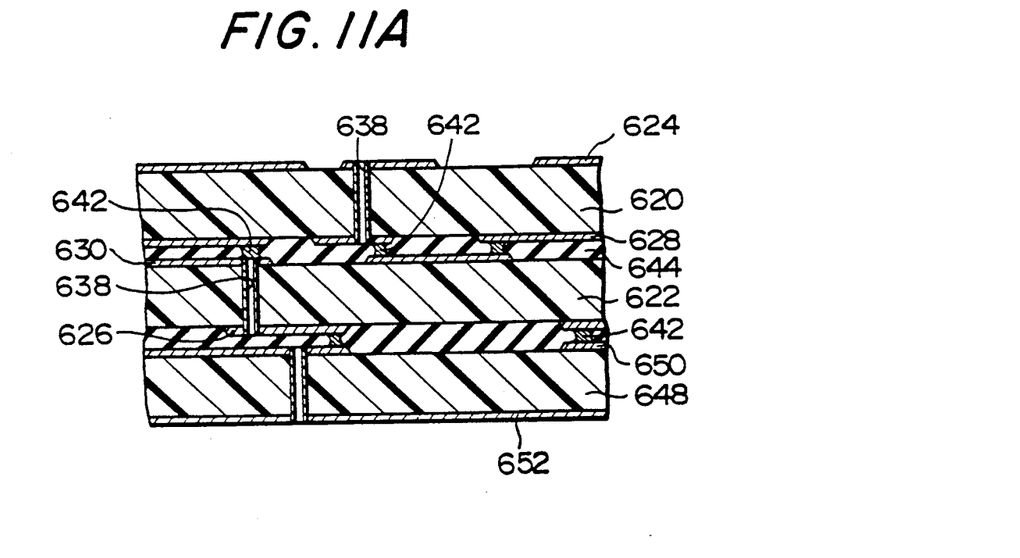
FIG. 11A is a cross-sectional view of components for manufacturing a multilayered PWB in a method according to a sixth embodiment.
Figure 11B:
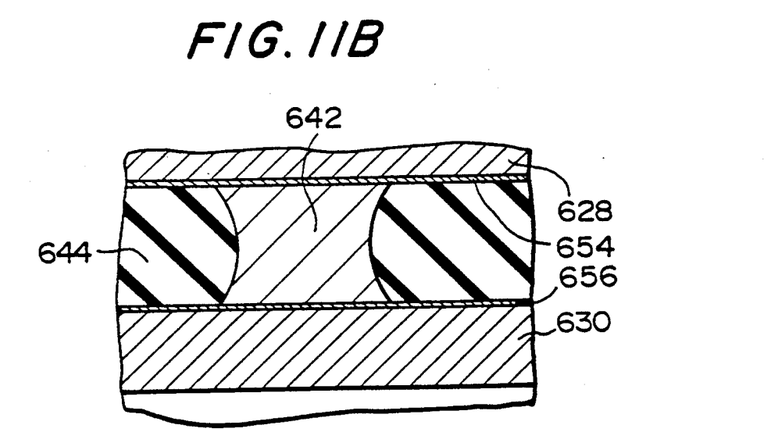
FIG. 11B is an enlarged cross-sectional view showing the surface of a conductive layer in the sixth embodiment.

FIGS. 11A and 11B show various components for manufacturing a multilayered PWB in a method according to a sixth embodiment.

In this embodiment, like the first embodiment, the forming of solder bumps, the attaching of polymer resins, the superimposing of the components, and the pressurizing and heating are conducted. As a result, a multilayered PWB (six-layered PWB) having a cross section shown in FIG. 11A has been obtained.

Further, the conductive layers are previously plated with platinum.

As shown in FIG. 11B, the surfaces of the conductive layers 628, 630 are provided with platinum layers 654, 656, respectively, having a thickness of about 0.5 μm by electroplating. Therefore the solder bumps are formed on the platinum layers 654, 656.

In the sixth embodiment, the same results as the first embodiment can be obtained. Additionally, it is possible to prevent any circuit pattern from being ruptured due to the heat cycle, for example. Since practically a PWB and a solder bump are different in coefficient of thermal expansion, the conductive layer would be subjected to a stress due to heat cycle, etc. In this embodiment, any stress exerted on the conductive layers 628, 630 is buffered by the platinum layers 654, 656 to thereby prevent any circuit pattern from being ruptured due to such a stress.

In the illustrated embodiments, the conductive layers are plated with platinum; alternatively, palladium may be used instead of platinum for the same results.

Further, in the foregoing embodiments, the multilayered PWB has a relatively small number of layers. But it may have a larger number of layers.

Figure 12:
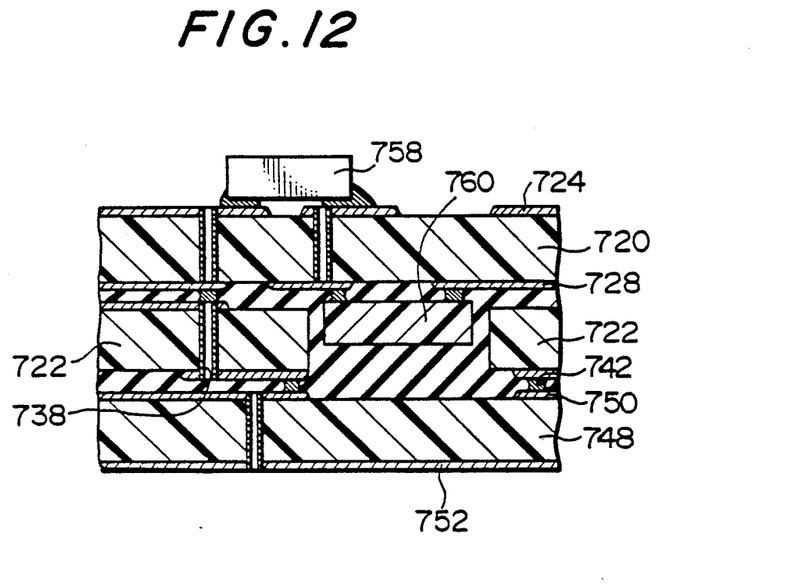
FIG. 12 is a cross-sectional view of components for manufacturing a multilayered PCB by adapting the method of the sixth embodiment.

The foregoing description concerning the multilayered PWB may be said for a multilayered PCB. For example, as shown in FIG. 12, it is possible to manufacture a multilayered PCB in which circuit elements 758, 760 have been installed on or in the superimposed layers in the same method as the sixth embodiment.

What is claimed is:

1. A method of manufacturing a multilayered print-wiring-board, comprising the steps of:
    attaching a conductive member on a partial surface of a conductive layer formed on at least one of opposite surfaces of a printed-wiring-board in a pattern;
    before aid attaching step, applying over the surface of said conductive layer a buffer layer for buffering a thermal stress resulting from a difference in coefficient of thermal expansion between said conductive layer and said conductive member;
    superimposing a plurality of printed-wiring-boards one over another in such a manner that said conductive member formed and attached on said conductive layer on one of said printed-wiring board confronts either said conductive layer or said conductive member on another of said plurality of said printed-wiring-boards, at least one of said plurality of printed-wiring-boards having been processed by said attaching step; and
    after said superimposing step, electrically connecting said conductive member to either said conductive layer of said conductive member of another of said plurality of said printed-wiring-boards which confronts said conductive member to form an electrical conductive layer.

2. A method of manufacturing a multilayered printed-wiring-board, comprising the steps of:
    attaching a conductive member on a partial surface of a conductive layer formed on at least one of opposite surfaces of a printed-wiring board in a pattern;
    printing an electrically insulating member on a partial surface of said conductive layer of at least a conductive-member-free portion thereof, said electrically insulating member including an insulating adhesive resin having a predetermined temperature of curing;
    superimposing a plurality of printed-wiring-boards one over another in such a manner that said conductive member attached on said conductive layer on one of said printed-wiring-boards confronts either said conductive layer or said conductive member on another of said plurality of printed-wiring-boards, at least one of said plurality of printedwiring-boards having been processed by the first-named attaching step and the printing step; and after said superimposing step, electrically connecting said conductive member to either said conductive layer or said conductive member of said another of said plurality of printed-wiring-boards which confronts said conductive member to form an electrically connecting layer.

3. A method of manufacturing a multilayered printed-wiring boards, comprising the steps of:

attaching a conductive member on a partial surface layer formed on at least one of opposite surfaces of a printed-wiring-board in a pattern;

attaching an electrically insulating member on a partial surface of said conductive member at least a conductive-member-free portion thereof and to a partial surface of said conductive layer so as to cover said conductive member, said electrically insulating member having a curing temperature lower than a melting point of said conductive member;

superposing a plurality of printed-wiring-boards one over another in such a manner that said conductive member attached on said conductive layer on one of said printed-wiring-boards confronts either said conductive layer or said conductive member on another of said plurality of said printed-wiring-boards, at least one of said plurality of printed-wiring-boards having been processed by the first-named attaching step and the second-named attaching step; and after said superimposing step, electrically connecting said conductive member to either said conductive layer or said conductive member of said another of said plurality of said printed-wiring-boards which confronts said conductive member to form an electrically connecting layer.

4. A method of manufacturing a multilayered printed-wiring-board, comprising the steps of:

(a) attaching a conductive member on a partial surface of a conductive layer formed on at least one of opposite surfaces of a printed-wiring-board in a pattern, said conductive member including a plurality of spacer pieces each having a substantially constant thickness;

(b) superimposing a plurality of printed-wiring-boards one over another in such a manner that said conductive member formed and attached on said conductive layer on one of said plurality of said printed-wiring-boards confronts either said conductive layer or said conductive member on another printed-wiring boards, at least one of said plurality of printed-wiring-boards having been processed by said attaching step; and (c) after said superimposing step, electrically connecting said conductive member to either said conductive layer or said conductive member of said another of said plurality of said printed-wiring-boards which confronts said conductive member to form an electrical connecting layer.

5. A method according to claim 9, wherein said conductive member is a cream solder having a melting point lower than that of said spacer pieces, said attaching step including a step of mixing said spacer pieces on said conductive member.

6. A method according to claim 5, wherein each of said spacer pieces is a sphere.

7. A method according to claim 5, wherein said spacer pieces are metal.

8. A method according to claim 9, wherein said conductive member is a conductive resin having a curing temperature lower than that of said spacer pieces, said attaching step including a step of mixing said spacer pieces in said conductive member.

* * * * *